(12) United States Patent
Kates

(10) Patent No.: US 8,014,549 B2
(45) Date of Patent: Sep. 6, 2011

(54) DYNAMIC RANGE COMPRESSION USING DIGITAL FREQUENCY WARPING

(75) Inventor: James M. Kates, Niwot, CO (US)

(73) Assignee: RN ReSound A/S (DK)

( * ) Notice: Subject to any disclaimer, the term of this patent is extended or adjusted under 35 U.S.C. 154(b) by 886 days.

(21) Appl. No.: 11/866,193

(22) Filed: Oct. 2, 2007

(65) Prior Publication Data

US 2008/0175422 A1 Jul. 24, 2008

Related U.S. Application Data

(62) Division of application No. 10/008,268, filed on Nov. 13, 2001, now Pat. No. 7,277,554.

(60) Provisional application No. 60/310,871, filed on Aug. 8, 2001.

(51) Int. Cl.
*H04R 25/00* (2006.01)

(52) U.S. Cl. .................................. 381/316; 381/312

(58) Field of Classification Search ............... 381/23.1, 381/312, 313, 316–317, 320–321
See application file for complete search history.

(56) References Cited

U.S. PATENT DOCUMENTS

| 6,738,486 B2 * | 5/2004 | Kaulberg | 381/318 |
| 7,277,554 B2 * | 10/2007 | Kates | 381/316 |

* cited by examiner

*Primary Examiner* — Suhan Ni
(74) *Attorney, Agent, or Firm* — Vista IP Law Group, LLP.

(57) ABSTRACT

A dynamic range compression system is provided, using either a sample-by-sample or a block processing system. Such a system can be used, for example, in a hearing aid. The system, using a frequency-warped processing system, is comprised of a cascade of all-pass filters with the outputs of the all-pass filters providing the input to the frequency analysis used to compute the filter coefficients. The compression filter is then designed in the frequency domain. Using a compression filter having even symmetry guarantees that the group delay is constant and does not depend on the compression gains at any given time. Additionally, due to the use of all-pass filters, the compression filter group delay more closely matches human auditory latency. An inverse frequency transform back into the warped time domain is used to produce the compression filter coefficients that are convolved with the outputs of the all-pass delay line to give the processed output signal.

21 Claims, 13 Drawing Sheets

US 8,014,549 B2

DYNAMIC RANGE COMPRESSION USING DIGITAL FREQUENCY WARPING

CROSS REFERENCE TO RELATED APPLICATION

The present application is a divisional of and claims the benefit of priority to prior U.S. application Ser. No. 10/008,268, by inventor James M. Kates, entitled "Method and Apparatus for Digital Synthesis of Microwaves," which claims benefit from U.S. Provisional Patent Application Ser. No. 60/310,871, filed Aug. 8, 2001, the entire disclosure of which is incorporated herein by reference in its entirely.

FIELD OF THE INVENTION

The present invention relates generally to audio systems and, more particularly, to a method and apparatus for dynamic range compression.

BACKGROUND OF THE INVENTION

A hearing impaired person typically suffers from a loss of hearing sensitivity, this loss dependent upon both the frequency and the audible level of the sound in question. Thus a hearing impaired person may be able to hear certain frequencies (e.g., low frequencies) as well as a non-hearing impaired person, but unable to hear sounds with the same sensitivity as the non-hearing impaired person at other frequencies (e.g., high frequencies). Similarly, the hearing impaired person may be able to hear loud sounds as well as the non-hearing impaired person, but unable to hear soft sounds with the same sensitivity as the non-hearing impaired person. Thus, in the latter situation, the hearing impaired person suffers from a loss of dynamic range.

A variety of analog and digital hearing aids have been designed to mitigate the above-identified hearing deficiencies. For example, frequency shaping techniques can be used to contour the amplification provided by the hearing aid, thus matching the frequency dependent hearing losses of the intended user. With respect to dynamic range loss, typically a compressor is used to compress the dynamic range of the input sound so that it more closely matches the dynamic range of the intended user. The ratio of the input dynamic range to the dynamic range output by the compressor is referred to as the compression ratio. Generally the compression ratio required by a user is not constant over the entire input power range.

Typically dynamic range compressors are designed to perform differently in different frequency bands, thus accounting for the frequency dependence (i.e., frequency resolution) of the intended user. Such multi-channel or multi-band compressors divide the input signal into two or more frequency bands, compressing each band separately. This design allows greater flexibility in varying not only the compression ratio, but also the time constants associated with each band. The time constants refer to the attack and release time constants. The attack time is the time required for the compressor to react and lower the gain at the onset of a loud sound. Conversely, the release time is the time required for the compressor to react and increase the gain after the cessation of the loud sound.

Conventional digital signal processing techniques such as those relying upon the discrete Fourier transform (DFT) provide constant bandwidth frequency resolution. Accordingly, such techniques are inappropriate for the present application. FIG. 1 illustrates one prior art approach to overcoming the mismatch between the uniform frequency analysis inherent in conventional digital processing and the non-uniform frequency resolution of the ear. As shown, a multi-channel filter bank 100 is used which is comprised of multiple filters 101 operating in parallel, the filters dividing the input signal 103 into multiple bands. Typically between two and four frequency bands are used in this type of system. The respective filter bandwidths and band edges are chosen to give an approximation to a critical band frequency scale. The compressor independently operates on the output 105 from each filter 101, the compressor output 107 being the sum of the individually compressed signals 109. Although this approach is relatively straightforward to implement and results in only a short digital processing delay, the relatively coarse frequency resolution can limit the ability of the system to provide the desired gain-versus-frequency characteristics commonly required for an arbitrary hearing loss.

FIG. 2 is an illustration of a second prior art approach to overcoming the deficiencies in conventional digital processing as applied to the non-uniform frequency resolution of the ear. In this approach, incoming signal 103 is processed in the frequency domain. A DFT is used for the frequency analysis, typically implemented using a fast Fourier transform (FFT) algorithm. The FFT performed at step 201 must be large enough to provide the desired frequency resolution at low frequencies. Summing overlapping groups of FFT bins forms the high frequency analysis bands. The compression gains are computed in the frequency domain using the power estimates in each analysis band (step 203). The compressor filter is applied in the frequency domain (step 205) and an inverse FFT is used to produce the amplitude-compressed signal (step 207). Operating the system at a 16 kHz sampling rate, a 128-point FFT can be used to process the buffered input data, resulting in 65 frequency samples between 0 and 7. From these 65 FFT bins, 14 overlapping frequency bands are formed for use in setting the compression gains. This approach has the advantage of good frequency resolution, but the increased resolution requires a large buffer to hold the input data prior to computing the FFT. As a result of signal buffering, a substantial digital processing delay may be realized, this delay being audible to the user in some situations.

In a modification to the above approach shown in FIG. 3, the compressor uses a side branch 301 for the frequency analysis. The results of the frequency analysis are used to generate the coefficients of a filter 303 placed in the signal path. A filter bank as illustrated in FIG. 1 or an FFT as shown in FIG. 3 is used for the frequency analysis. As with the system shown in FIG. 2, summing overlapping groups of FFT bins at high frequencies provides the approximation to the auditory frequency analysis. The side-branch system illustrated in FIG. 3 results in minimal digital processing delay as the direct signal path contains only the short input buffer 305 and the finite impulse response (FIR) filter 303. The resolution of the frequency analysis performed in the side branch is limited by the size of the FFT and its associated input buffer. In the system illustrated in FIG. 3, again assuming a sampling rate of 16 kHz, a 32-point FFT is computed (step 307) with the positive frequency samples combined to give nine overlapping frequency bands. Increasing the FFT buffer size by including more past samples of the input signal would give better frequency resolution, but would also increase the time lag between changes in the incoming signal amplitude and the modified gain values that are applied to that signal.

Although a variety of different signal processing systems have been implemented in hearing aids, none of the systems have provided the desired frequency resolution in combina-

SUMMARY OF THE INVENTION

A dynamic range compression system is provided, which uses either a sample-by-sample or a block processing system. Such a system can be used, for example, in a hearing aid. The compression system, using a frequency-warped processing system, is comprised of a cascade of all-pass filters with the outputs of the all-pass filters providing the input to the frequency analysis used to compute the filter coefficients. The compression filter is then designed in the frequency domain. An inverse frequency transform back into the warped time domain is used to produce the compression filter coefficients that are convolved with the outputs of the all-pass delay line to give the processed output signal.

Thus, in one aspect, the invention is an audio processing system such as used in a hearing aid, the audio processing system comprised of an input transducer, an analog-to-digital converter, a plurality of first order all-pass filters, windowing means, frequency domain transform applying means, means for calculating a plurality of frequency domain level estimates and a warped time-domain filter, means for performing an inverse frequency domain transform, convolving means, a digital-to-analog converter, and an output transducer. In a preferred embodiment, the frequency domain transform is a FFT. In another preferred embodiment, the frequency domain transform is a DFT. In yet another preferred embodiment, the frequency domain transform is a Goertzel algorithm.

In another aspect, the invention is an audio processing system such as used in a hearing aid, the audio processing system comprised of an input transducer, an analog-to-digital converter, an input data buffer, a plurality of first order all-pass filters, means for windowing a first and second portion of a sequence of delayed samples, frequency domain transform applying means, means for calculating a first and second warped power spectra, means for summing and normalizing the first and second warped power spectra, means for calculating a warped time-domain filter, means for performing an inverse frequency domain transform, convolving means, a digital-to-analog converter, and an output transducer. In a preferred embodiment, the frequency domain transform is a FFT. In another preferred embodiment, the frequency domain transform is a DFT. In yet another preferred embodiment, the frequency domain transform is a Goertzel algorithm.

In yet another aspect, the invention is an audio processing system such as used in a hearing aid, the audio processing system comprised of an input transducer, an analog-to-digital converter, an input data buffer for holding a block of data of size M, 2M first order all-pass filters, means for windowing a portion of a sequence of delayed samples of size M, 2M-point frequency domain transform applying means, means for calculating a plurality of frequency domain level estimates and a warped time-domain filter, means for performing an inverse frequency domain transform, convolving means, a digital-to-analog converter, and an output transducer. In a preferred embodiment, the frequency domain transform is a FFT. In another preferred embodiment, the frequency domain transform is a DFT. In yet another preferred embodiment, the frequency domain transform is a Goertzel algorithm.

In yet another aspect, the invention is a method of processing sound, such as used in a hearing aid, the method comprising the steps of receiving and converting analog input signals to digital input signals, passing digital input signals through a plurality of first order all-pass filters, windowing a sequence of delayed samples, forming a warped sequence of delayed samples, calculating a plurality of frequency domain level estimates and a warped time domain filter, forming a set of compression filter coefficients, convolving a sequence of delayed samples with the set of compression filter coefficients to form a digital output signal, converting the digital output signal to an analog output signal, and converting the analog output signal to an audio signal. In a preferred embodiment, the warped sequence of delayed samples is formed using a FFT. In another preferred embodiment, the warped sequence of delayed samples is formed using a DFT. In another preferred embodiment, the warped sequence of delayed samples is formed using a Goertzel algorithm. In another preferred embodiment, the set of compression filter coefficients is formed using an inverse frequency domain transform. In another preferred embodiment, the set of compression filter coefficients is formed using an inverse FFT.

In yet another aspect, the invention is a method of processing sound, such as used in a hearing aid, the method comprising the steps of receiving and converting analog input signals to digital input signals, passing digital input signals through a data buffer and through a plurality of first order all-pass filters, windowing a first and second portion of a first sequence of delayed samples, forming a first and second warped sequence of delayed samples, calculating a first and second warped power spectrum, summing and normalizing the first and second warped power spectrum, forming a warped time domain filter, forming a set of compression filter coefficients, convolving a second sequence of delayed samples with the set of compression filter coefficients to form a digital output signal, converting the digital output signal to an analog output signal, and converting the analog output signal to an audio signal. In a preferred embodiment, the first and second warped sequences of delayed samples are formed using a FFT. In another preferred embodiment, the first and second warped sequences of delayed samples are formed using a DFT. In another preferred embodiment, the first and second warped sequences of delayed samples are formed using a Goertzel algorithm. In another preferred embodiment, the set of compression filter coefficients is formed using an inverse frequency domain transform. In another preferred embodiment, the set of compression filter coefficients is formed using an inverse FFT.

In yet another aspect, the invention is a method of processing sound, such as used in a hearing aid, the method comprising the steps of receiving and converting analog input signals to digital input signals, passing digital input signals through a data buffer and a plurality of first order all-pass filters wherein the data buffer holds a block of data of size M and there are 2M first order all-pass filters, windowing a portion of size M of the sequence of delayed samples, applying a 2M-point frequency domain transform on the windowed sequence of delayed samples, calculating a plurality of frequency domain level estimates and a warped time domain filter, forming a set of compression filter coefficients, convolving a second portion of size M of the sequence of delayed samples with the set of compression filter coefficients to form a digital output signal, converting the digital output signal to an analog output signal, and converting the analog output signal to an audio signal. In a preferred embodiment, the 2M-point frequency domain transform uses a FFT. In another preferred embodiment, the 2M-point frequency domain transform uses a DFT. In another preferred embodiment, the 2M-point frequency domain transform uses a Goertzel algorithm. In another preferred embodiment, the set of compression filter coefficients is formed using an inverse frequency domain transform. In another preferred embodiment, the set of compression filter coefficients is formed using an inverse FFT.

A further understanding of the nature and advantages of the present invention may be realized by reference to the remaining portions of the specification and the drawings.

DESCRIPTION OF THE SPECIFIC EMBODIMENTS

Figure 4:
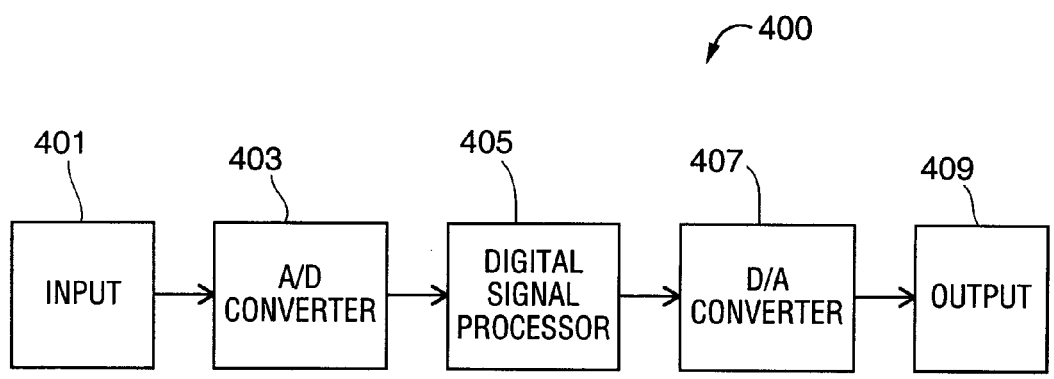
FIG. 4 is a simplified block diagram of a digital hearing aid.

FIG. 4 is a simplified block diagram of a digital hearing aid 400, used herein for exemplary purposes only. It is understood that the signal processing system of the present invention can also be used in other applications, such as audio systems, audio broadcasting, telephony, and the like. It should also be understood that hearing aid 400 can be an in-the-canal, in-the-ear, behind-the-ear, or otherwise mounted hearing aid. It should also be understood that depending upon the techniques employed within the digital signal processor, hearing aid 400 can represent either a prior art hearing aid or a hearing aid in accordance with the present invention.

Hearing aid 400 is comprised of an input transducer 401, preferably a microphone, an analog-to-digital (A/D) converter 403, a digital processing means 405 (e.g., a digital signal processor or DSP), a digital-to-analog (D/A) converter 407, and an output transducer 409, preferably a speaker. In operation, input transducer 401 receives audio signals and converts the audio signals into analog electrical signals. The analog electrical signals are converted by A/D converter 403 into digital electrical signals that are subsequently processed by DSP 405 to form a digital output signal. The digital output signal is converted by D/A converter 407 into an analog electrical signal. The analog signal is used by output transducer 409, e.g., a speaker, to produce an audio signal that is heard by the user of hearing aid 400.

Frequency Warping

The principles of digital frequency warping are known and therefore only a brief overview follows. Frequency warping is achieved by replacing the unit delays in a digital filter with first-order all-pass filters. The all-pass filters implement a bilinear conformal mapping that changes the frequency resolution at low frequencies with a complementary change in the frequency resolution at high frequencies.

The all-pass filter used for frequency warping is given by:

$$A(z) = \frac{z^{-1} - a}{1 - az^{-1}} \quad \text{(Eq. 1)}$$

where a is the warping parameter. For a real, setting a>0 increases the frequency resolution at low frequencies and setting a<0 increases the resolution at high frequencies. For the present application, preferably the selected value of a gives a frequency scale corresponding to the auditory frequency analysis. The optimal value for the warping parameter that gives the closest fit to the Bark frequency scale is given by:

$$a = 0.8517[\tan^{-1}(0.06583\, f_s)]^{1/2} - 0.1916 \quad \text{(Eq. 2)}$$

where $f_s$ is the sampling rate in kHz. For a sampling rate of 16 kHz, the optimal value for a is 0.5756. The warped digital frequency scale is given by:

$$\Omega(\omega) = \tan^{-1}\left[\frac{(1-a^2)\sin(\omega)}{(1+a^2)\cos(\omega) + 2a}\right] \quad \text{(Eq. 3)}$$

An FFT in the unwarped frequency domain would produce values at uniformly spaced frequencies $\omega_k$ along the frequency axis $0 \leq \omega \leq 2\pi$. An FFT computed in the warped frequency domain would have samples at the frequencies $\Omega(\omega_k)$ given by the transformation of Eq. (3).

Figure 5:
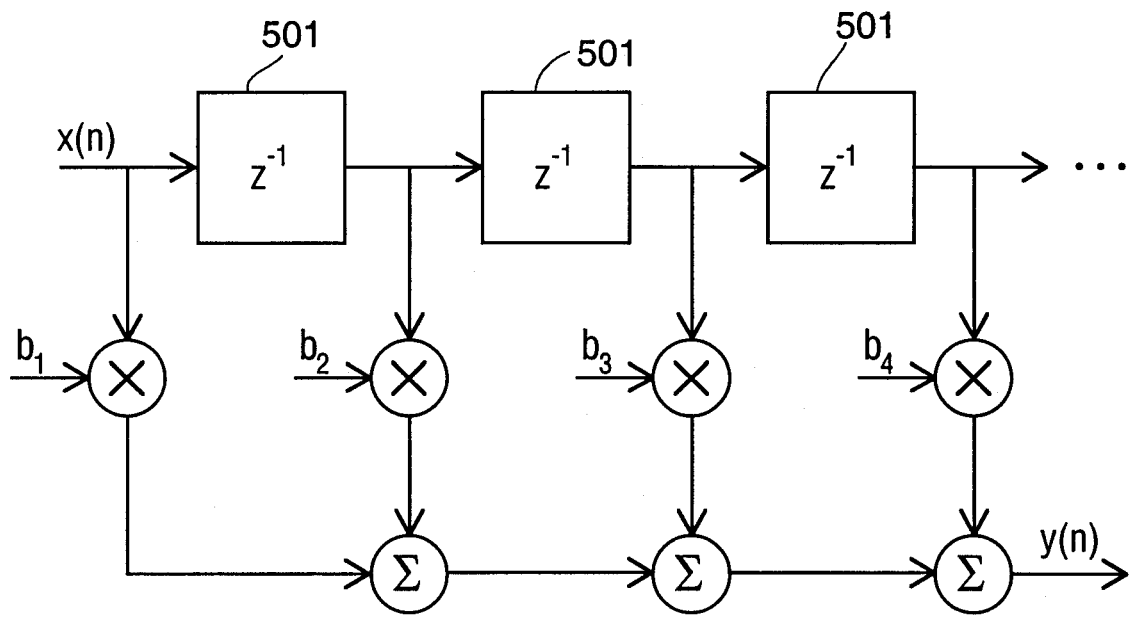
FIG. 5 illustrates a conventional FIR filter.
Figure 6:
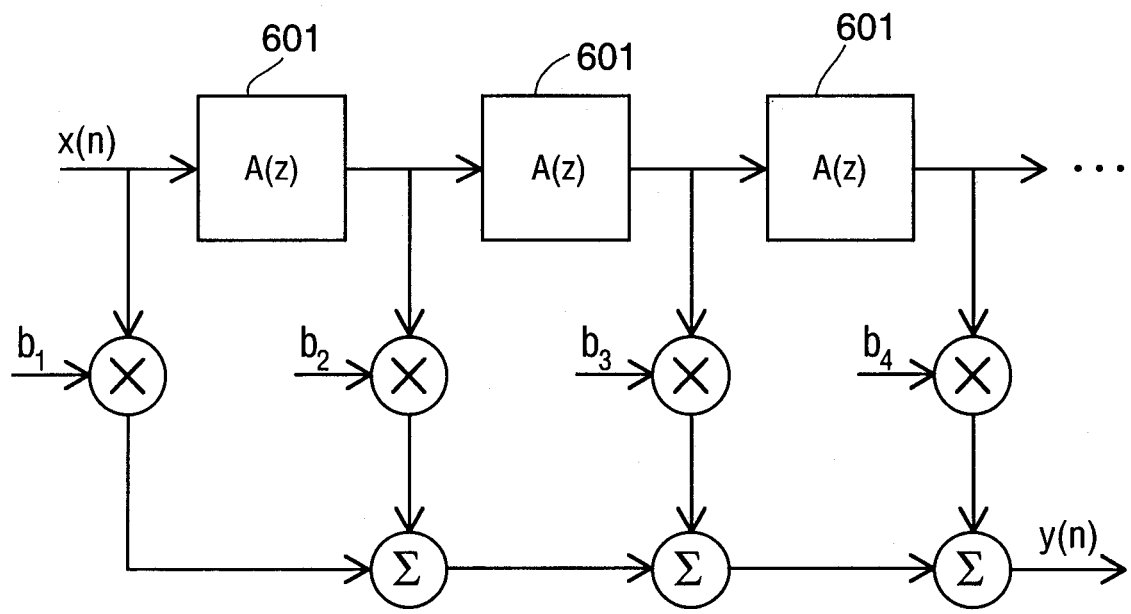
FIG. 6 illustrates a warped FIR filter.

A conventional FIR filter is shown in FIG. 5 and a warped FIR filter is shown in FIG. 6. The warped filter is constructed from the unwarped FIR filter by replacing the unit delays $z^{-1}$ (501) with the all-pass filters A(z) (601). The z-transform of the conventional FIR filter is given by:

$$B(z) = \sum_{k=0}^{K} b_k z^{-k} \quad \text{(Eq. 4)}$$

for a filter having K+1 taps. Assuming that the filter coefficients, $b_k$, have even symmetry gives $b_k = b_{K-k}$. For K odd, the filter has an even number of taps and the z-transform can be rewritten as:

$$B(z) = \sum_{k=0}^{(K-1)/2} b_k [z^{-k} + z^{-(K-k)}] \quad \text{(Eq. 5)}$$

Rearranging the delay terms leads to:

$$B(z) = \sum_{k=0}^{(K-1)/2} b_k z^{-K/2}[z^{-(k-K/2)} + z^{(k-K/2)}] \quad \text{(Eq. 6)}$$

$$= z^{-K/2} \sum_{k=0}^{(K-1)/2} b_k [z^{-(k-K/2)} + z^{(k-K/2)}]$$

Evaluating the z-transform on the unit circle gives:

$$B(e^{j\omega}) = e^{-j\omega K/2} \sum_{k=0}^{(K-1)/2} 2b_k \cos[\omega(k - K/2)] \quad \text{(Eq. 7)}$$

The term outside the summation represents a fixed delay. The term inside the summation is pure real and is therefore zero-phase and does not contribute to the filter delay. The symmetric FIR filter is therefore a linear phase filter with a constant filter delay that does not depend on the actual filter coefficients as long as the symmetry is maintained. If the conventional (i.e., unwarped) FIR filter has K+1 taps, then the delay is K/2 samples.

The analysis for the symmetric warped FIR filter proceeds along the same lines as for the conventional FIR filter. The filter delay will again be evaluated for a symmetric filter having an even number of taps. (Note that the analysis for an odd number of taps is similar). The z-transform of a warped FIR filter is given by:

$$\tilde{B}(z) = \sum_{k=0}^{K} b_k A^k(z) \quad \text{(Eq. 8)}$$

where A(z) is the all-pass filter given by Eq. (1). Assuming again that the filter coefficients have an even symmetry yields $b_k = b_{K-k}$. For K odd, the filter has an even number of taps and the z-transform can be rewritten as:

$$\tilde{B}(z) = \sum_{k=0}^{(K-1)/2} b_k [A^k(z) + A^{(K-k)}(z)] \quad \text{(Eq. 9)}$$

Rearranging the delay terms leads to:

$$\tilde{B}(z) = \sum_{k=0}^{(K-1)/2} b_k A^{K/2}(z)[A^{(k-K/2)}(z) + A^{-(k-K/2)}(z)] \quad \text{(Eq. 10)}$$

$$= A^{K/2}(z) \sum_{k=0}^{(K-1)/2} b_k [A^{(k-K/2)}(z) + A^{-(k-K/2)}(z)]$$

The filter delay is determined by evaluating Eq. (10) on the unit circle. Note that $A^{-1}(e^{j\omega}) = A^*(e^{j\omega})$ where the asterisk "*" denotes the complex conjugate. Thus the term outside the summation in Eq. (10) represents a fixed frequency-dependent group delay and the term inside the summation is again pure real and does not contribute to the filter group delay. The symmetric warped FIR filter thus has a fixed frequency-dependent group delay that does not depend on the actual filter coefficients as long as the symmetry is maintained. If the warped FIR filter has K+1 taps, then the group delay is K/2 times the group delay of a single all-pass filter.

Figure 7:
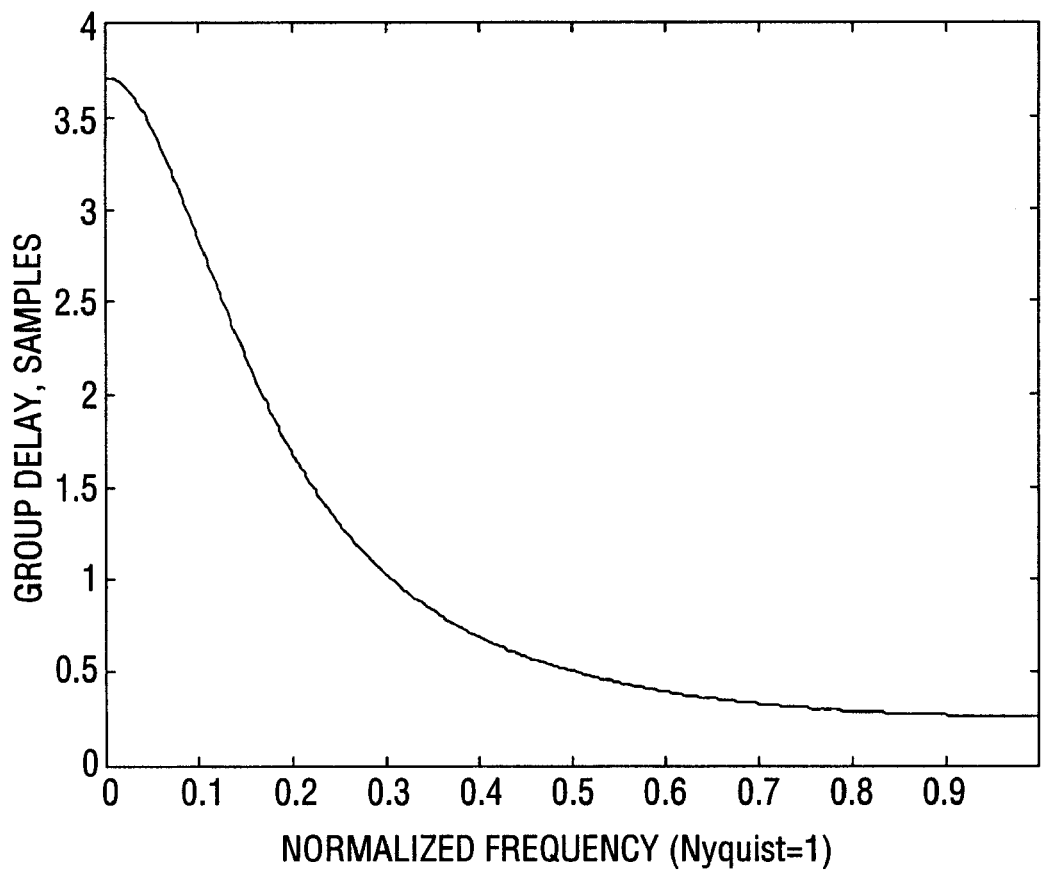
FIG. 7 illustrates the group delay for a single first-order all-pass filter section having a=0.5756.

The group delay for an all-pass filter used for frequency warping is shown in FIG. 7, assuming a 16-kHz sampling rate and the associated optimal all-pass filter parameter for the Bark frequency scale. The group delay for one all-pass section ranges from 3.71 samples at 0 Hz to 0.27 samples at 8 kHz, and is 1 sample at 2.44 kHz. Thus for frequencies below 2.44 kHz, the symmetric warped system has a greater delay than the symmetric conventional FIR having the same number of taps, and the warped system has a shorter delay above 2.44 kHz. The overall group delay for a 15-tap (i.e., K=14) symmetric warped FIR filter would be seven times the values for a single all-pass stage, giving a delay ranging from 26 samples at 0 Hz to 1.9 samples at 8 kHz. For a 31-tap (i.e., K=30) symmetric warped FIR filter, the delay would range from 115 samples at 0 Hz to 8.4 samples at 8 kHz.

Figure 8:
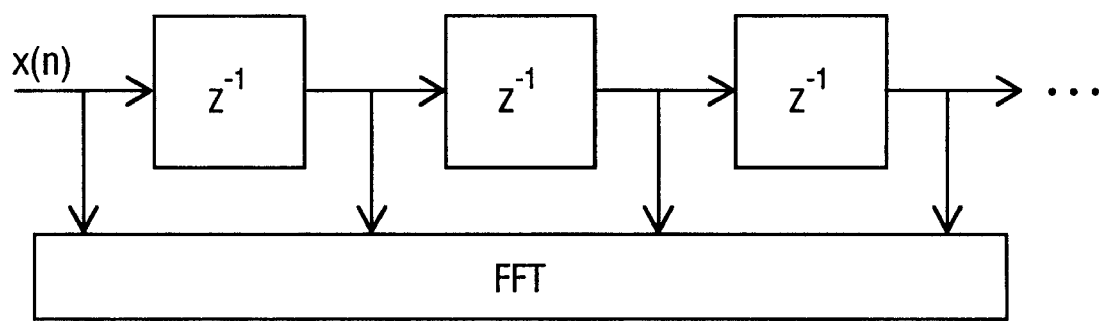
FIG. 8 illustrates a conventional FFT.
Figure 9:
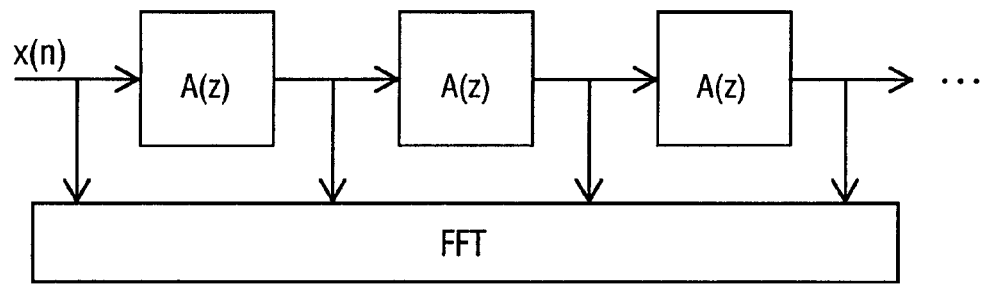
FIG. 9 illustrates a warped FFT.

The FFT can also be computed in the warped frequency domain, as shown in FIGS. 8 and 9. In the conventional FFT of FIG. 8, the FFT is computed using the contents of a buffer containing the present and past samples of the signal being analyzed. For the warped FFT shown in FIG. 9, the unit delays implicit in filling the data buffer are replaced with all-pass filters. The properties of a warped FFT parallel those of the unwarped FFT. Windowing the contents of the all-pass filtered data buffer, for example, reduces the warped FFT sidelobe level. Windowing the data in the buffer is equivalent to smoothing the FFT in the warped frequency domain. Using a hanning (von Hann) window, for example, is equivalent to a three-point frequency-domain smoothing function in which each FFT bin is combined with its neighbor to either side. This property still holds in the warped frequency domain, but because the FFT bin frequency spacing has been warped, the frequency extent of the smoothing has also been warped by an equivalent amount. Thus the frequency smoothing for the warped FFT is by a constant amount on the Bark frequency scale.

Warped Compression System

Figure 10:
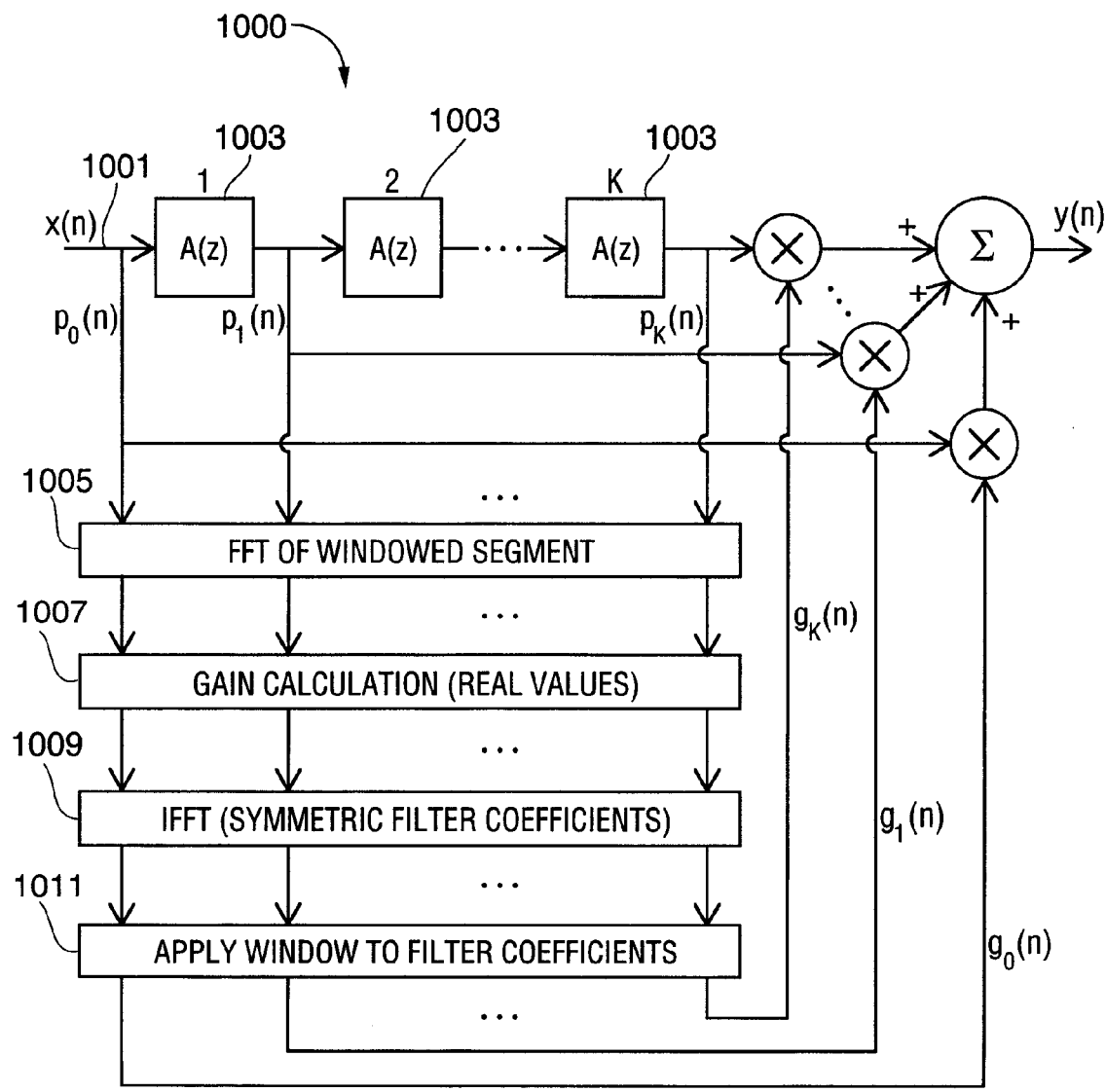
FIG. 10 illustrates a compressor that uses a warped frequency scale for both the frequency analysis and the filtered signal synthesis.
Figure 11:
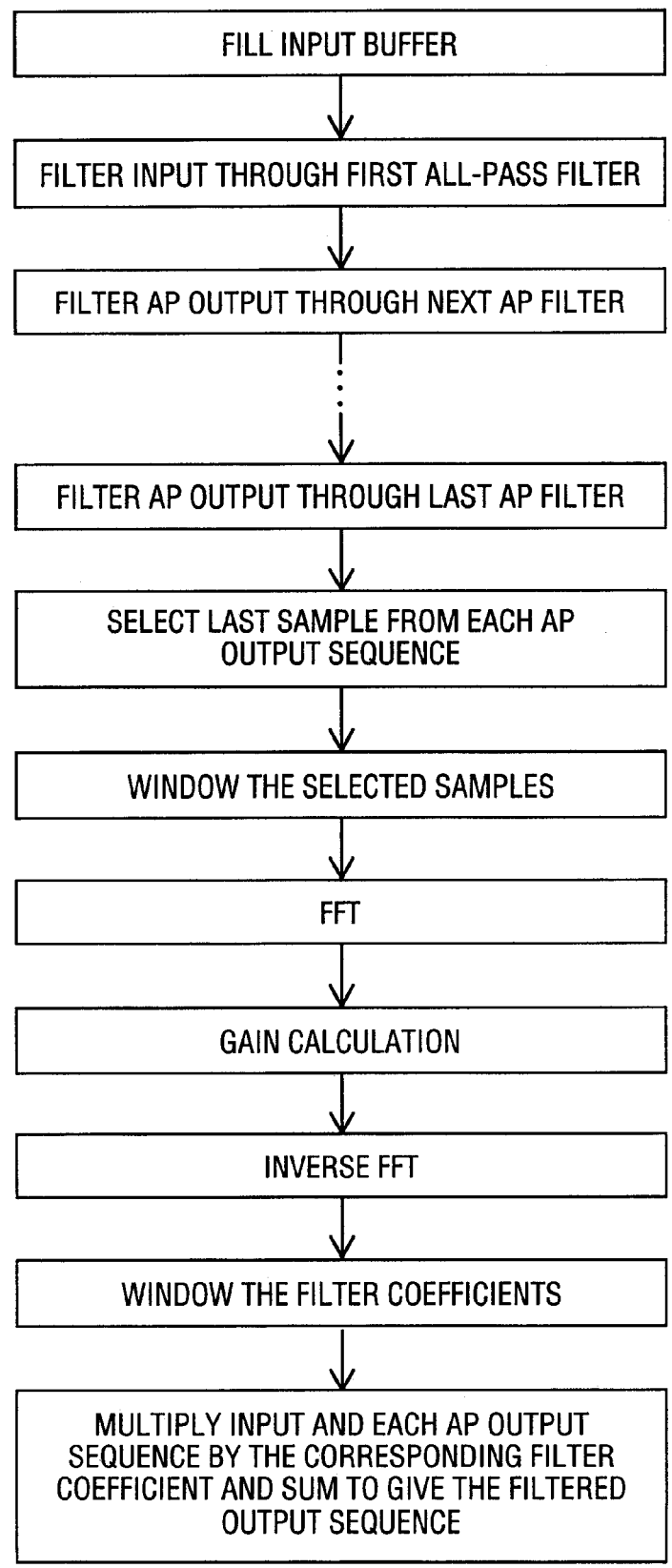
FIG. 11 illustrates the use of block time-domain processing in the warped compression system of the present invention.

A dynamic-range compression system using warped frequency analysis is presented in FIG. 10, the compression system being applicable to the digital processing means of an audio system such as the hearing aid shown in FIG. 4. FIG. 10 shows a sample-by-sample processing implementation although the invention can also be applied to a block time-domain processing implementation as illustrated in FIG. 11. Compressor 1000 combines a warped FIR filter and a warped FFT. The same tapped delay line is used for both the frequency analysis and the FIR compression filter. The incoming signal x(n) (1001) is passed through a cascade of first-order all-pass filters 1003 of the form given by Eq. (1). The output of the $k^{th}$ all-pass stage is given by:

$$p_0(n) = x(n)$$

$$p_k(n) = a[p_k(n-1) - p_{k-1}(n)] + p_{k-1}(n-1), \ 1 \leq k \leq K \quad \text{(Eq. 11)}$$

The sequence of delayed samples $\{p_k(n)\}$ is then windowed and a FFT calculated using the windowed sequence (1005). The result of the FFT is a spectrum sampled at a constant spacing on a Bark frequency scale. Since the data sequence is windowed, the spectrum is smoothed in the warped frequency domain thereby giving overlapping frequency bands. The frequency domain level estimates (e.g., power spectrum) is computed from the warped FFT and the frequency domain gain coefficients (e.g., compression gains) then computed from the warped power spectrum for the auditory analysis bands (1007). As the frequency domain gain coefficients are pure real numbers, the inverse FFT of the warped time-domain filter results in a set of filter coefficients that is real and has even symmetry (1009). The system output is then calculated by convolving the delayed samples with the compression gain filter (1011):

$$y(n) = \sum_{k=0}^{K} g_k(n) p_k(n) \quad \text{(Eq. 12)}$$

where $\{g_k(n)\}$ are the compression filter coefficients.

In comparison with a conventional FIR system having the same FIR filter length, the warped compression system will require more computational resources because of the all-pass filters in the tapped delay line. However, in many cases the warped FIR filter will be shorter than the conventional FIR filter needed to achieve the same degree of frequency resolution. For example, a nine-band compressor requires a 31-tap conventional FIR filter but can be realized with a 15-tap warped FIR filter.

As previously noted, the warped compression system of the present invention can also be implemented using block time-domain processing as shown in FIG. 11 instead of the sample-by-sample processing shown in FIG. 10.

For an input data buffer containing M samples, for example where M equals 16, one approach is to have M delay stages in the tapped delay line and to use a FFT of length M for the warped frequency analysis. A sliding window is used to give a 50-percent overlap of the FFT power spectra. The overlap is provided by processing M/2 samples through the delay line, windowing the data, and computing an M-point FFT. The remaining M/2 samples are then processed through the delay line and a second windowed M-point FFT computed. Power spectra are computed from the two FFTs and then summed and normalized to give the power spectrum used for the compression gain calculation. The output sequence y(n) is computed as the input data is sent through the tapped delay line using the gains calculated from the previous data block.

A second approach is to have M samples in the input data buffer but 2M stages in the tapped delay line and to use an FFT of length 2M for the warped frequency analysis. Half the contents of the delay line relate to the previous M-sample block of data and half relate to the incoming block of data. The sliding window for the 50-percent data overlap is realized by computing a windowed 2M-point FFT every M samples. The power spectrum computed from the 2M-point FFT is used for the compression gain calculation and again the output sequence y(n) is computed as the input data is sent through the tapped delay line using the gains calculated from the previous data block.

For example, one embodiment of the warped FIR system consists of a 16-sample data buffer and a 32-point warped FFT used in conjunction with a 31-tap warped FIR filter. The input data segment, after passing through the all-pass stages that provide the frequency warping, is windowed with a 32-point hanning (von Hann) window. The sliding window for the 50-percent data overlap is realized by computing a windowed 32-point FFT every 16 input samples. The frequency domain gain coefficients are computed in the warped frequency domain, transformed into the warped time domain, and then smoothed by applying a 31-point hanning (von Hann) window to the enhancement filter coefficients. The speech segment is then convolved with the compression filter in the warped time domain to give the processed output.

Embodiments

The frequency-warped processing system consists of a cascade of all-pass filters with the outputs $\{p_k(n)\}$ of the all-pass filters providing the input to the frequency analysis used to compute the filter coefficients. The compression filter is then designed in the frequency domain. An inverse frequency transform back into the warped time domain is then used to produce the compression filter coefficients $\{g_k(n)\}$ convolved with the outputs of the all-pass delay line to give the processed output signal of Eq. (12).

Frequency Analysis

Several types of frequency analysis can be used in computing the filter coefficients. An FFT was used in the previous description as this form of frequency analysis is easily implemented and computationally efficient. However, for a short frequency transform length (e.g., 32 samples), other frequency domain transforms may also be used. For example, the invention can use a discrete Fourier transform (DFT) computed directly from the all-pass filter outputs, the Goertzel algorithm, or other approach. Additionally, the warped FIR filter length does not need to be a power of 2; any filter length can be used for the DFT calculation and FFT algorithms exist for many different transform sizes.

For some applications it is desirable for the warped FIR filter coefficients to exhibit even symmetry. Frequency domain transforms, such as the cosine transform, may be appropriate for producing symmetric sets of coefficients. Note, however, that in the general case the warped filter coefficients are not required to exhibit even symmetry. Removing the symmetry constraint can result in a shorter filter to achieve the same magnitude frequency response, but the filter group delay will change as the filter coefficients vary.

It is also possible to provide the frequency analysis using a warped filter-bank structure. This approach uses a parallel FIR filter bank but replaces the conventional unit delays with all-pass filters. A set of low-pass, high-pass, and/or band-pass filters is generated using a separate set of warped FIR filter coefficients for each frequency band. The signal power in each band is detected, the compression gain computed for the band using the detected power estimate, and the computed gain applied to the signal in the band. The signal bands with their separate frequency domain gain coefficients are then summed to form the output signal.

It is also possible to vary the group delay of the all-pass filters by shifting the pole location given by the all-pass filter parameter a. The pole location can be made to vary in response to the signal characteristics. Another possibility is to cascade all-pass filter sections having different group delays or to combine all-pass sections with sections having unit delays. Higher-order all-pass sections can also be used for the warped filter.

Compression Simulation Results

Compression Systems

In order to evaluate the performance of a compression system utilizing frequency warping, four different compression systems were simulated. The characteristics of the compressors are summarized in the table below.

TABLE I

Compression system properties

| Property | Compression System | | | |
|---|---|---|---|---|
| | FFT | Side Branch | Warp-15 | Warp-31 |
| Data Buffer Size | 56 | 16 | 16 | 16 |
| Input FFT Size | 128 | 32 | 2 × 16 | 32 |
| Input Window | 88-Point Stretched Hann | 32-Point Blackman | 50% Overlap 16-Point Hann | 32-Point Hann |

TABLE I-continued

Compression system properties

| Property | Compression System | | | |
|---|---|---|---|---|
| | FFT | Side Branch | Warp-15 | Warp-31 |
| Freq Smoothing | 50% Band Overlap | None at LF Overlap at HF | None | None |
| No. Freq. Bands | 14 | 9 | 9 | 17 |
| Coef. Smoothing | 5-Point | None | None | 3-Point (Hann Window) |
| IFFT Size | 128 | 32 | 16 | 32 |
| FIR Filter Length | — | 31 | 15 | 31 |

Figure 1:
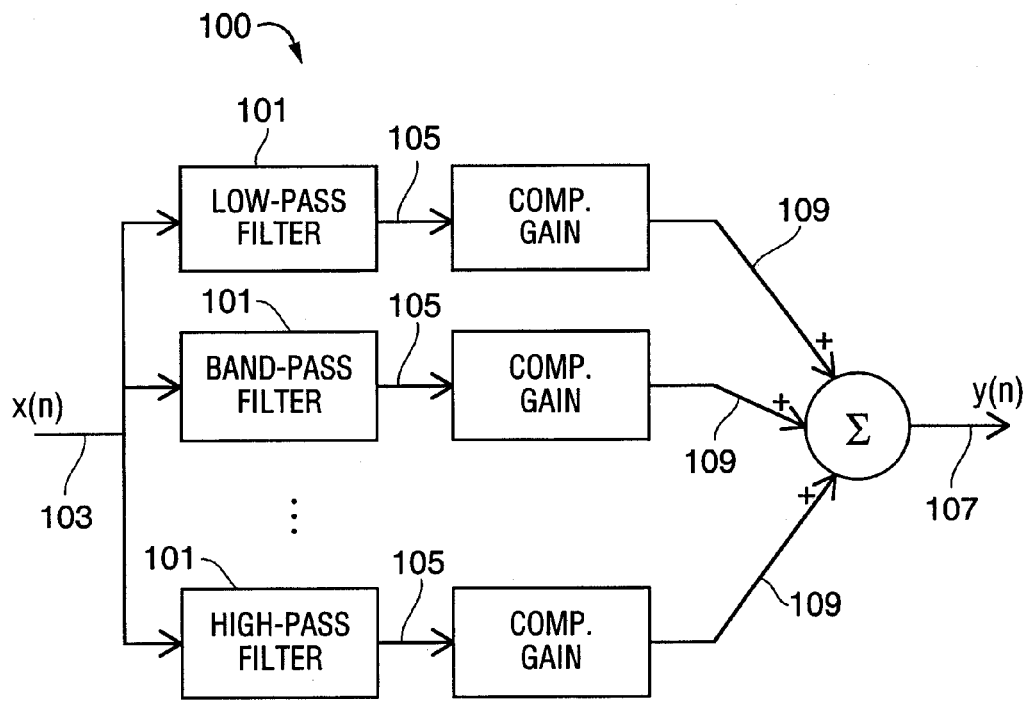
FIG. 1 illustrates a multi-band compressor using a digital filter bank according to the prior art.
Figure 2:
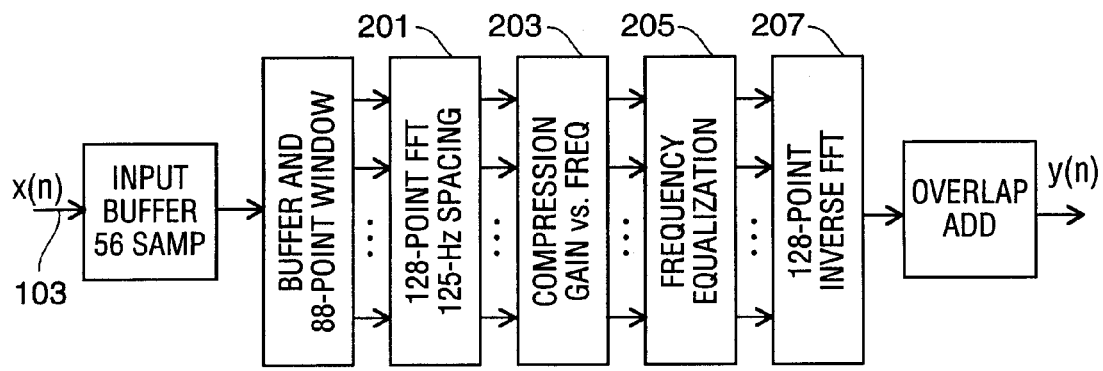
FIG. 2 illustrates a second prior art approach to overcoming the deficiencies in conventional digital processing as applied to the non-uniform frequency resolution of the ear.

All of the systems operated at a 16-kHz sampling rate and were simulated in MATLAB using the default double-precision floating-point arithmetic. The first compressor is the FFT system of FIG. 2 which uses a 56-sample input buffer and a 128-point FFT for the frequency analysis. Overlapping FFT bins are combined to form 14 analysis bands for the compression gain calculation. The gains are interpolated in the frequency domain and smoothed using a five-point frequency-domain smoother before being applied to the FFT of the data to produce the filtered output. This system is termed the FFT compressor.

Figure 3:
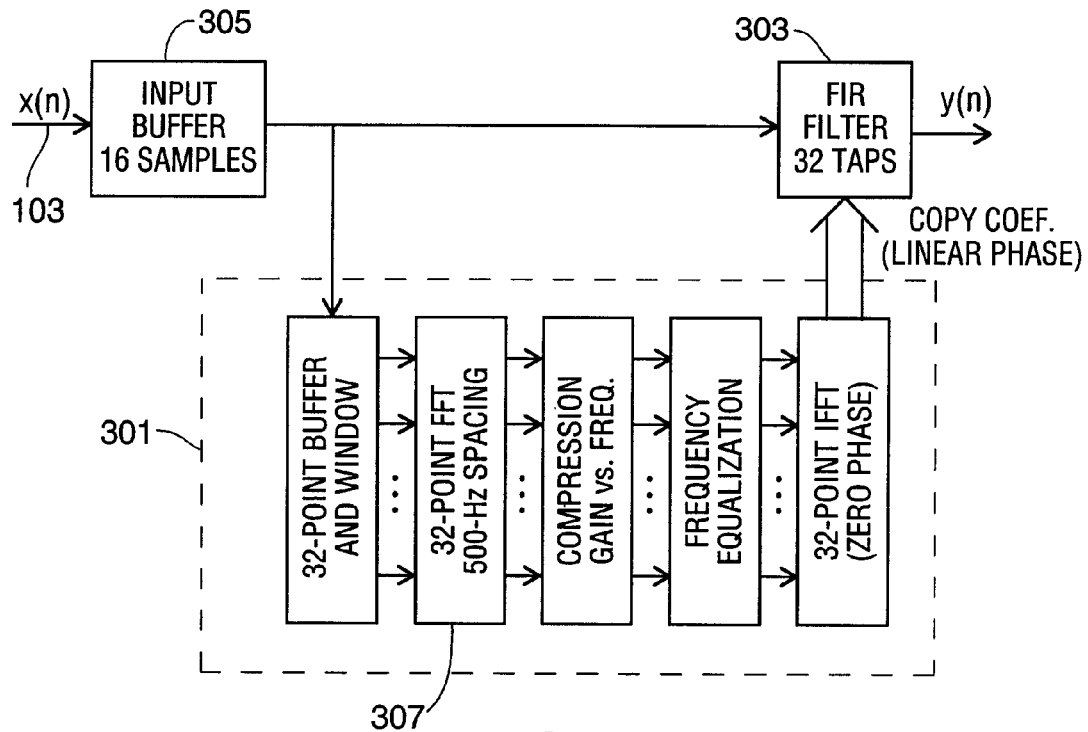
FIG. 3 illustrates a compressor using a side branch for frequency analysis with the compression gains applied to the signal through an FIR filter in the signal path.

The second compressor is the side-branch system of FIG. 3. A 16-sample buffer is used for the block time-domain processing and the signal is processed by a 31-tap FIR filter. The frequency analysis uses a 32-point FFT operating on the present and previous 16-point data segments. A Blackman window is used to provide adequate FFT smoothing at low frequencies and overlapping FFT bins are summed to give the analysis bands at high frequencies. This system has a total of 9 analysis bands. The compression gains are calculated in the frequency domain and the gains inverse transformed without smoothing to give the symmetric compression filter used to modify the incoming signal. This system is termed the Side-Band compressor.

The third compressor is the warped FIR side-branch system of FIG. 10 in which a 16-sample data buffer and overlapping 16-point FFTs are used in conjunction with a 15-tap warped FIR filter. The input data segments are windowed with a 16-point hanning (von Hann) window and no frequency-domain smoothing is applied to the spectrum or to the compression gain values. This system is termed the Warp-15 compressor.

The fourth compressor is also a warped FIR side-branch system with a 16-sample data buffer. This compressor, however, uses a 32-point FFT in conjunction with a 31-tap warped FIR filter. Therefore this compressor is essentially the frequency-warped version of the Side-Branch compressor of FIG. 3. The input data segment is windowed with a 32-point hanning (von Hann) window and no frequency-domain smoothing is applied to the spectrum. The frequency domain gain coefficients are smoothed by applying a 31-point hanning (von Hann) window to the compression filter after the gain values are transformed into the time domain. This last system is termed the Warp-31 compressor.

The center frequencies of the analysis bands for the four different compressors are presented in Table II below. The bands of the Warp-31 compressor are uniformly spaced on the Bark scale and include both 0 Hz and the Nyquist frequency since the analysis bands are the warped FFT bins. The Warp-15 compressor uses an FFT half the size of the one used in the Warp-31 compressor so its analysis bands are given by every other FFT bin indicated for the Warp-31 compressor. The FFT compressor combines overlapped FFT bins from the 128-point FFT to form the analysis bands. The bins are combined to give an approximation to the Bark scale and the deviations from the Bark scale are small. The Side-Branch compressor uses the output of a 32-point FFT to approximate frequency bands on a Bark scale and the limited resolution of the short FFT causes a poor match between the Side Branch frequency bands and the Bark band spacing at low frequencies. At high frequencies, however, the match is reasonably good.

TABLE II

Band center frequencies in Hz for the compression systems.

| FFT | Side Branch | Warp-15 | Warp-31 |
|---|---|---|---|
| | | 0 | 0 |
| 125 | 125 | | 135 |
| 188 | | 273 | 273 |
| 313 | | | |
| 438 | 500 | | 415 |
| 625 | | 566 | 566 |
| | | | 728 |
| 875 | 1000 | 907 | 907 |
| 1188 | | | 1108 |
| | | 1340 | 1340 |
| 1625 | 1750 | | 1615 |
| 2125 | | 1952 | 1952 |
| | 2250 | | 2378 |
| 2813 | 3000 | 2937 | 2937 |
| 3688 | 3750 | | 3698 |
| 4813 | 5000 | 4761 | 4761 |
| 6313 | 6375 | | 6215 |
| 7063 | | 8000 | 8000 |

All four of the compressors were set up to give the same compression behavior. The selected compression parameters are summarized in Table III. The attack and release times and the lower and upper compression knee-points were chosen to match those of a typical hearing aid. The compression ratio was set to 2:1 in all of the analysis bands and the input/output curves were identical in all of the bands.

TABLE III

The selected compression parameters for the four compressors. The parameters are identical in all frequency bands.

| Parameter | Value |
|---|---|
| ANSI Attack Time | 5 msec |
| ANSI Release Time | 70 msec |
| Lower Compression Knee | 45 dB SPL |
| Upper Compression Knee | 100 dB SPL |
| Gain, 50 dB SPL Input | 30 dB |
| Gain, 80 dB SPL Input | 15 dB |
| Compression Ratio | 2:1 |

Compressor Ripple

An important characteristic of a compressor is the amount of ripple present in the output when the system is excited by a swept sinusoid. The ripple occurs when a sinusoid having a frequency at the edge between two bands receives a different amount of gain than a sinusoid having a frequency at the center of a band. When a signal frequency is on the edge between two analysis bands, it will be present in both bands at a reduced intensity and each band will assign a higher compression gain because of the reduced signal level. A signal frequency at the center of band, on the other hand, will be present primarily in that band and at the highest possible intensity, and so will receive a reduced gain. As a sinusoid is swept, it will be present in several bands simultaneously, depending on the shape of the analysis bands and the extent of the band edges, and the net gain will fluctuate with frequency. The band edges depend on the size of the analysis FFT, the data windowing, and the degree of overlap between bands.

For the compressor ripple test, each of the four systems was excited with a swept sinusoid and the system output was envelope detected to show the ripple. The swept test signal was five seconds in duration. The logarithmic sweep started at 200 Hz and went to 8 kHz and the signal level was set to 70 dB SPL. The output envelope detection for the compression systems based on the 16-sample block size used the same ANSI 5-msec attack and 10-msec release time constants as were used for the compressor operation. The output envelope detection for the FFT compression system, which is based on the 56-sample block size, used time constants scaled to 3.5 times these values. Some ripple is present in the envelope-detected signal even for a sinusoidal output at a constant level, but the amount ripple in the envelope detector is typically less than 0.25 dB.

The output signal envelopes for the four compressors are presented in FIGS. 12-15. The FFT compressor was designed to have very little ripple and the success of this design is evident in the output signal envelope shown in FIG. 12. There is an overall output signal level variation of about 2 dB as the swept sinusoid moves from low to high frequencies. A superimposed ripple of about 0.4 dB that is most prominent at high frequencies accompanies this gross output level variation.

Figure 13:
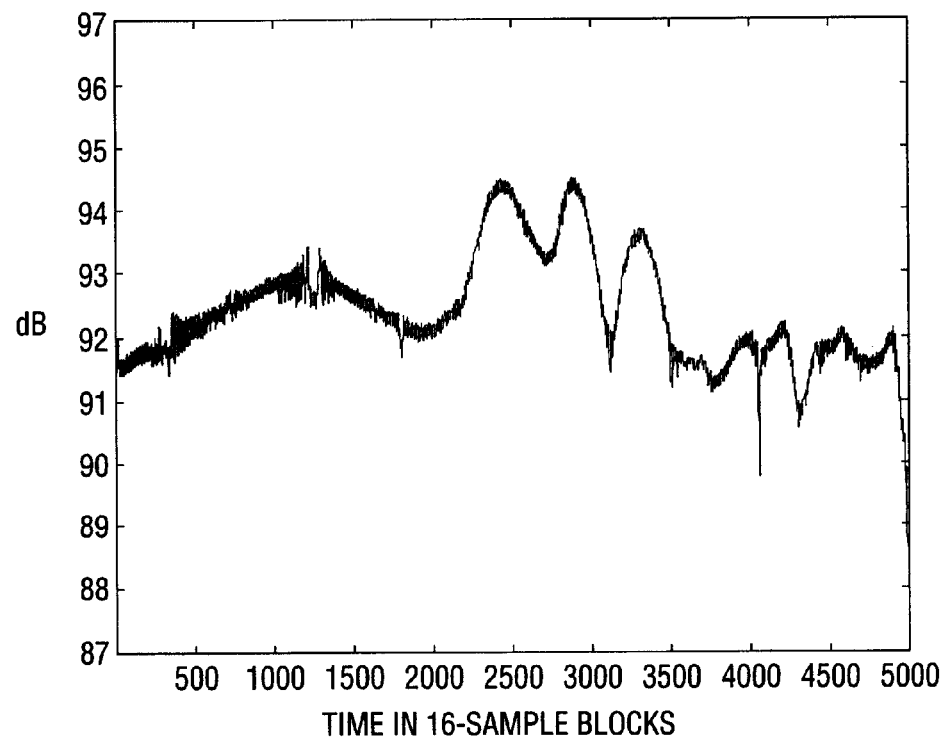
FIG. 13 illustrates the Side-Branch compressor output signal envelope for a swept sinusoid excitation.

The output signal envelope for the Side-Branch compressor is shown in FIG. 13. This system uses coarser frequency analysis and a shorter compression filter than the FFT compressor, thus yielding greater ripple in the output envelope. The overall output signal varies by about 2.5 dB as the sinusoid is swept from low to high frequencies. The ripple varies with frequency because the frequency analysis starts with one FFT bin per analysis band at low frequencies but overlaps FFT bins to create the analysis bands at high frequencies. The ripple is about 1.5-2 dB after the gross output level variation has been removed.

Figure 14:
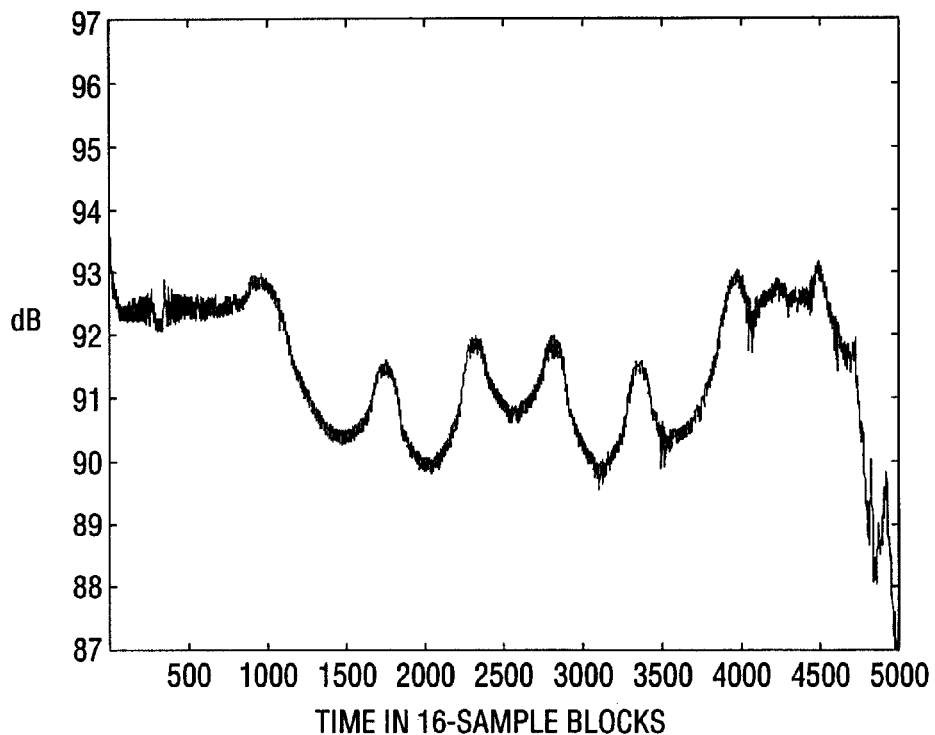
FIG. 14 illustrates the Warp-15 compressor output signal envelope for a swept sinusoid excitation.

The output signal envelope for the Warp-15 compressor is shown in FIG. 14. The Warp-15 compressor does not combine any FFT bins to form the frequency analysis bands. It uses an FFT that is half the length of the FFT used for the Side-Branch frequency analysis and a warped FIR filter that is half the length of the Side-Branch compressor conventional FIR filter to convolve the input signal with the compression gains. The frequency resolution of the Warp-15 compressor is better than that of the Side-Branch compressor since the Warp-15 compressor uses a hanning (von Hann) window rather than a Blackman window for the data buffer and the warped 16-point FFT bins are spaced closer together at low frequencies than the frequency bins of the 32-point conventional FFT. Despite these differences, the ripple behavior for the Warp-15 compressor is surprisingly similar to that for the Side-Branch compressor. Again, the overall output signal envelope variation is about 2.5 dB and the ripple is about 1.5-2 dB after the gross output level variation has been removed.

Figure 12:
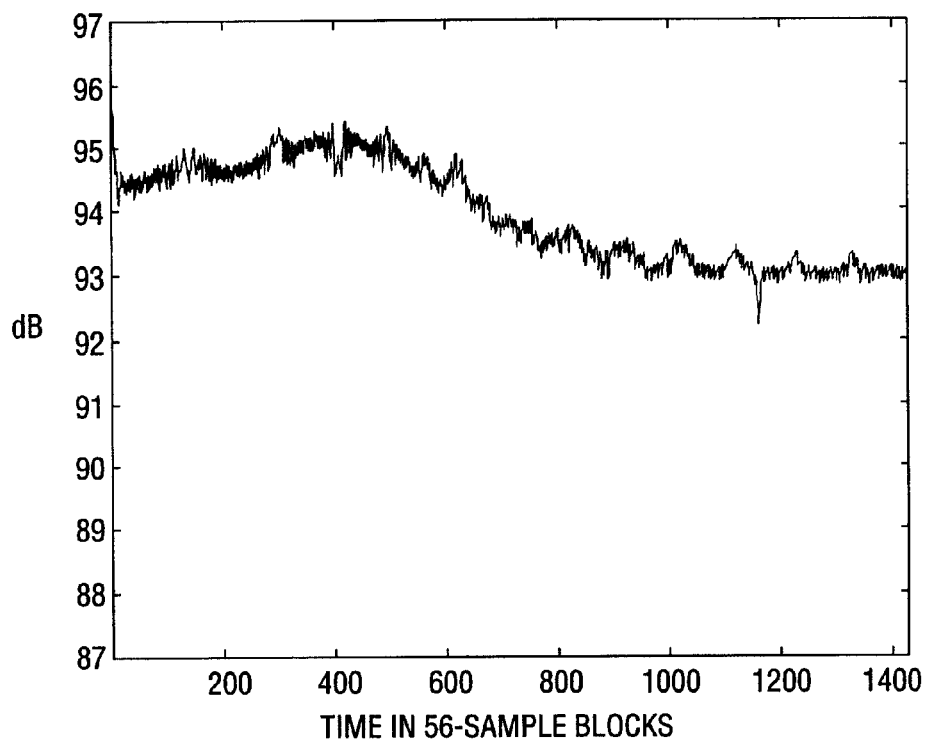
FIG. 12 illustrates the FFT compressor output signal envelope for a swept sinusoid excitation.
Figure 15:
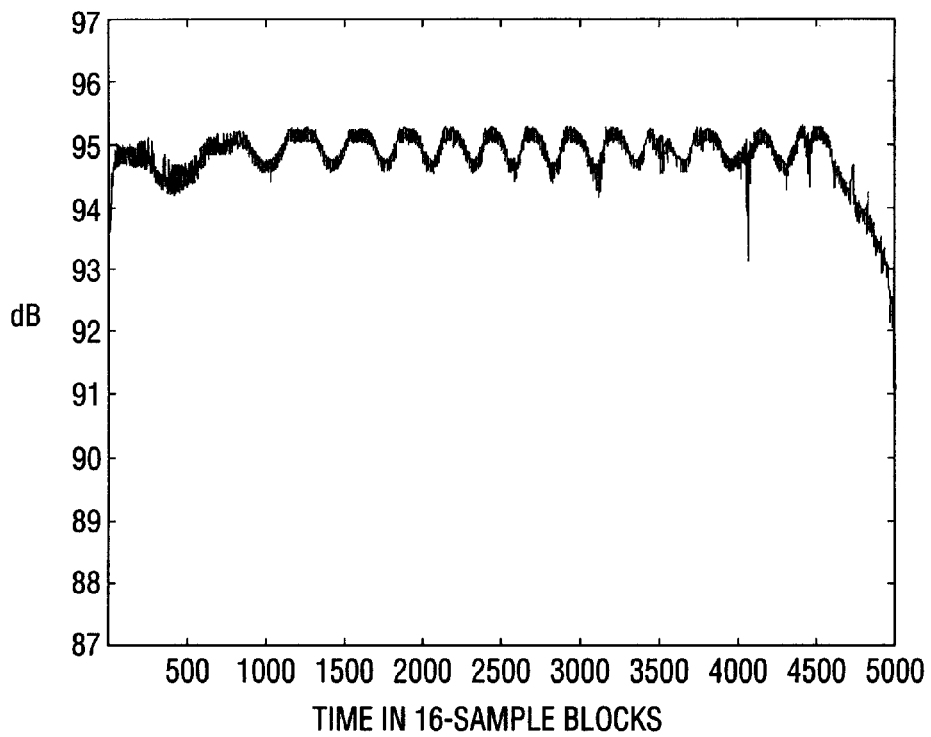
FIG. 15 illustrates the Warp-31 compressor output signal envelope for a swept sinusoid excitation.

The output signal envelope for the Warp-31 compressor is shown in FIG. 15. Like the Warp-15 compressor, the Warp-31 compressor uses a hanning (von Hann) window on the input data buffer and uses the warped FFT bins directly as the frequency analysis bands. The Warp-31 FIR filter also uses a hanning (von Hann) window on the filter coefficients to provide additional smoothing that is not present in the Warp-15 system. The envelope of the Warp-31 system output shown in FIG. 12 is the flattest of all the compression systems, showing essentially no gross output level variation. The ripple is very uniform across frequency and has a peak-to-peak amplitude of about 0.5 dB.

Note that the size of the warped FFT and the warped FIR filter for the Warp-31 system are the same as for the Side-Branch compressor although the Side-Branch compressor uses conventional frequency analysis and filtering. The improved performance of the Warp-31 system is a direct result of having a much better match between the signal processing and the auditory filters that underlie the multi-channel compressor design. The Warp-31 system gives better results than those obtained for the FFT system despite having a much shorter input data buffer and hence greatly reduced group delay at mid and high frequencies.

Distortion

A second criterion for evaluating a compressor is the amount of non-linear distortion generated by the system. Distortion is caused by rapid fluctuations in the frequency-dependent gain imposed on the signal by the compressor. These gain fluctuations are most prominent for a signal having large amplitude fluctuations itself, such a speech, but will arise even for a sinusoid at a constant amplitude and frequency because of the variation in the estimated signal level from block to block. Any change in the estimated signal level (for a signal amplitude in the active range of the compressor) will cause the compressor gain to adjust in response. The amount of distortion depends on the compressor attack and release times and the compression ratio, with faster times and greater compression ratios yielding greater amounts of distortion.

A second cause of distortion is the temporal aliasing present in the FFT compressor system. In a frequency-domain filtering system, the length of the data segment being processed plus the length of the filter must be less than or equal to the size (plus 1) of the FFT being used for the processing. If this condition is not met, the length of the filtered signal exceeds that of the FFT and the tail of the response will be wrapped around to the beginning, giving rise to temporal aliasing. In the FFT compressor, the length of the compression filter is not directly limited; the frequency-domain smoothing of the compressor filter gains provides an approximate constraint on the filter length that reduces temporal aliasing for most signals but does not eliminate it. The coefficients of the smoothing filter were empirically chosen to render aliasing distortion inaudible for most signals and the compression parameter settings of interest. Note that temporal aliasing distortion is not present in the other compression systems.

For the compressor distortion test, each of the four systems was excited with the same swept sinusoid used for the ripple test. The distortion was analyzed using spectrograms generated by the MATLAB "specgram" function with an FFT size of 512 samples and a 50-percent overlap. A hanning (von Hann) data window was used. Although FIGS. 16-20 are shown in black and white, the originals used "jet" color mapping with a 100-dB amplitude scale and the signal level normalized to give a maximum of 0 dB. In the original graphs, the level represented by yellow was approximately 35 dB below that represented by red, medium blue 70 dB below red, and indigo 100 dB below red. Distortion appears as signal power at frequencies other than the excitation frequency.

Figure 16:
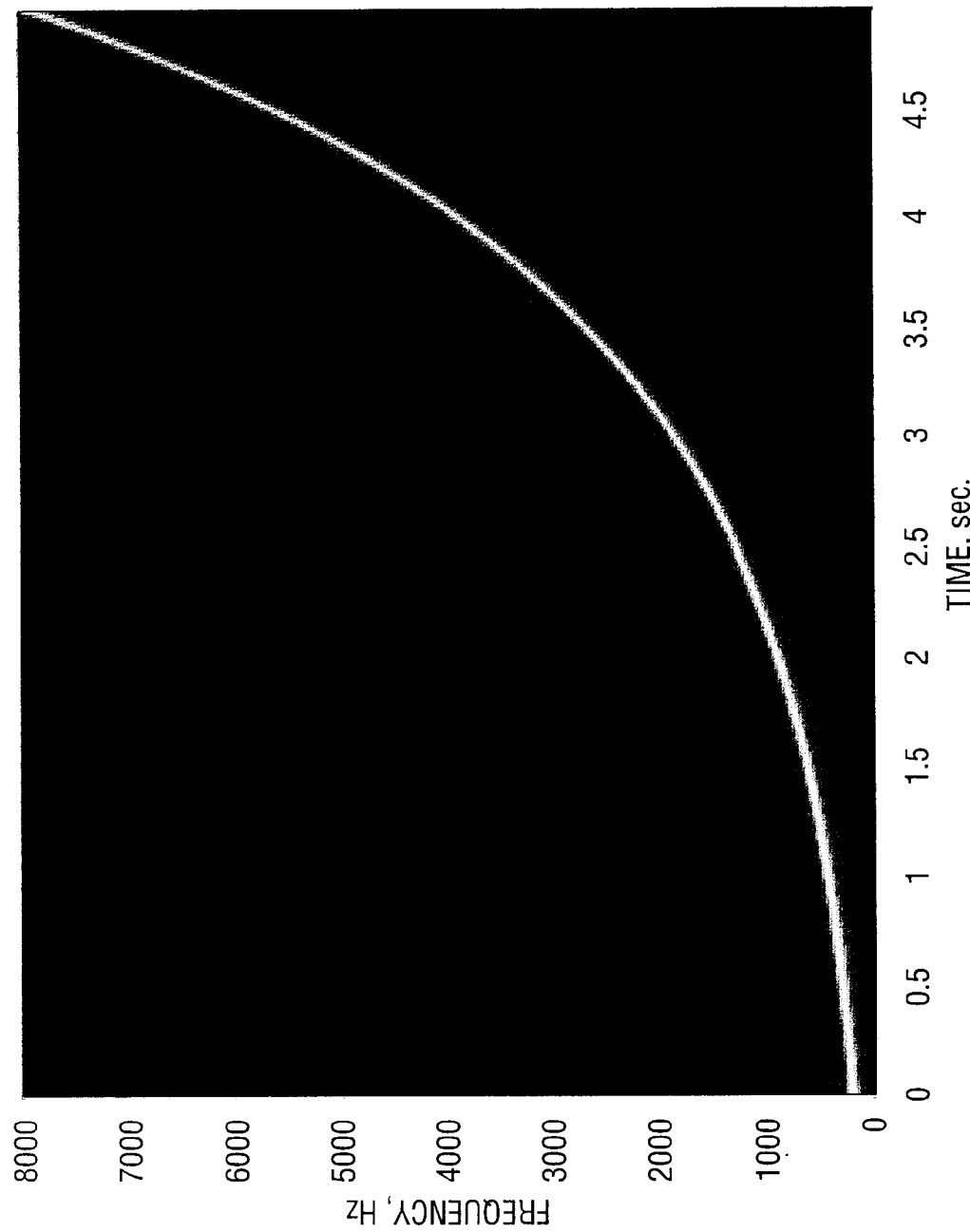
FIG. 16 illustrates the spectrogram for the swept sinusoid excitation signal used for distortion testing.

The reference condition is the spectrogram of the excitation signal, shown in FIG. 16. The frequency of the swept tone is the dark line. The sidelobes of the FFT analysis used in the spectrogram appear as a narrow halo surrounding the swept tone. The sidelobe level falls off quickly to a level of more than 100 dB below the level of the swept tone.

Figure 17:
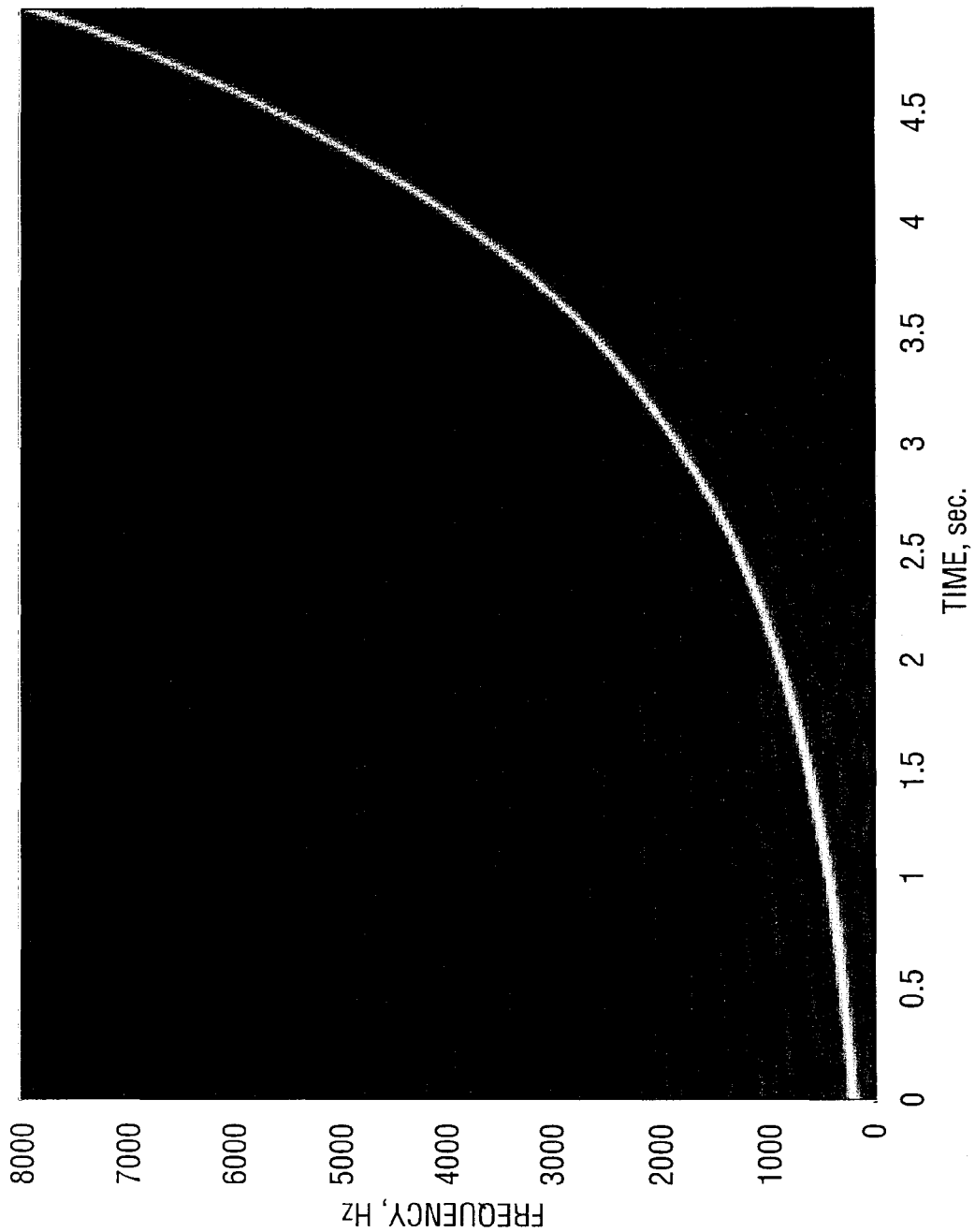
FIG. 17 illustrates the spectrogram for the FFT compressor response to the swept sinusoid.

The spectrogram for the FFT compression system is shown in FIG. 17. The FFT compressor has two sources of distortion, these being the compressor gain fluctuations and the temporal aliasing. As a result, the FFT compressor has the highest amount of distortion of all of the compressors considered here. This compressor produces a latticework of distortion products in the time-frequency space of the spectrogram with most of the distortion products at a level of about 40-50 dB below that of the swept tone output.

Figure 18:
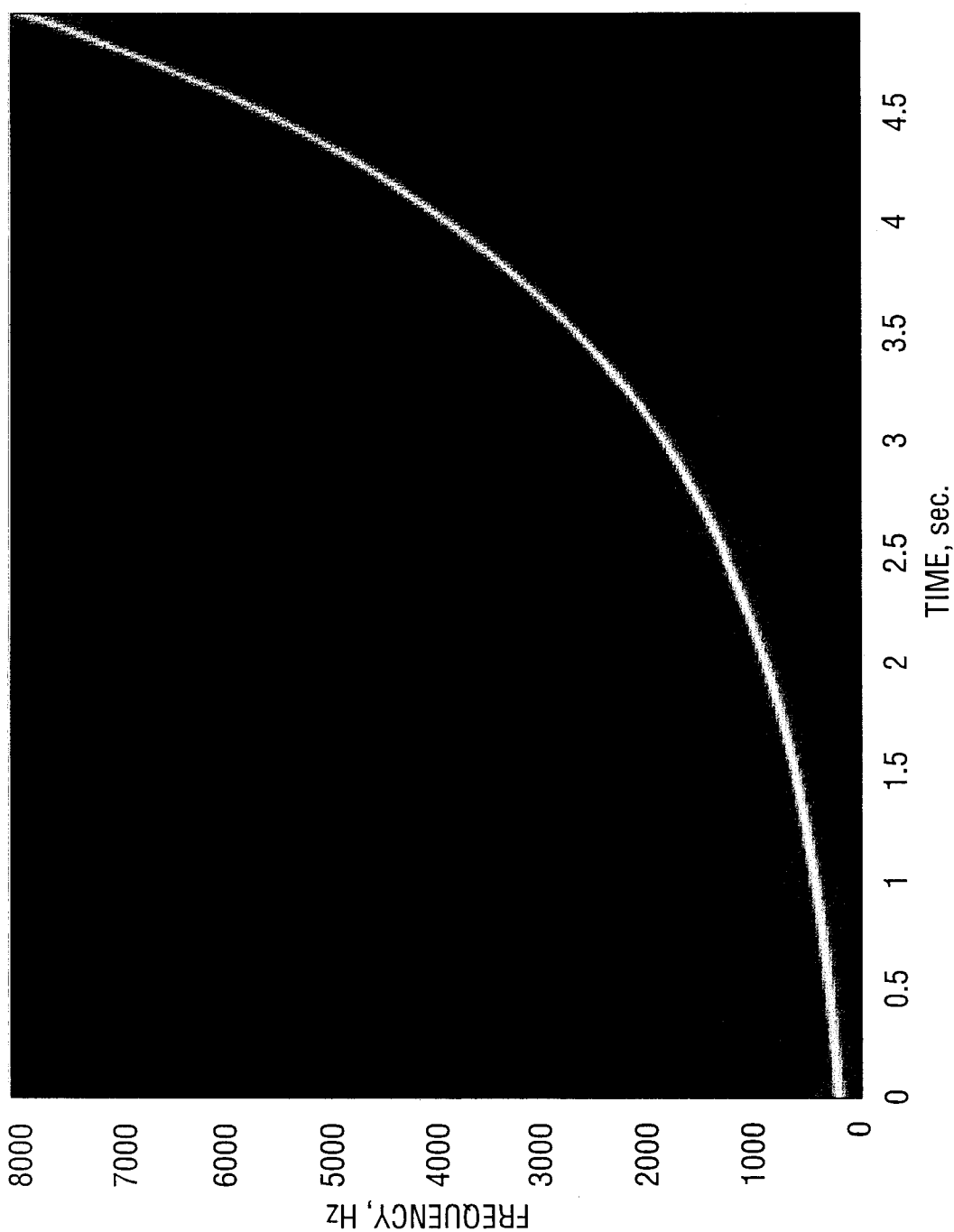
FIG. 18 illustrates the spectrogram for the Side-Branch compressor response to the swept sinusoid.
Figure 19:
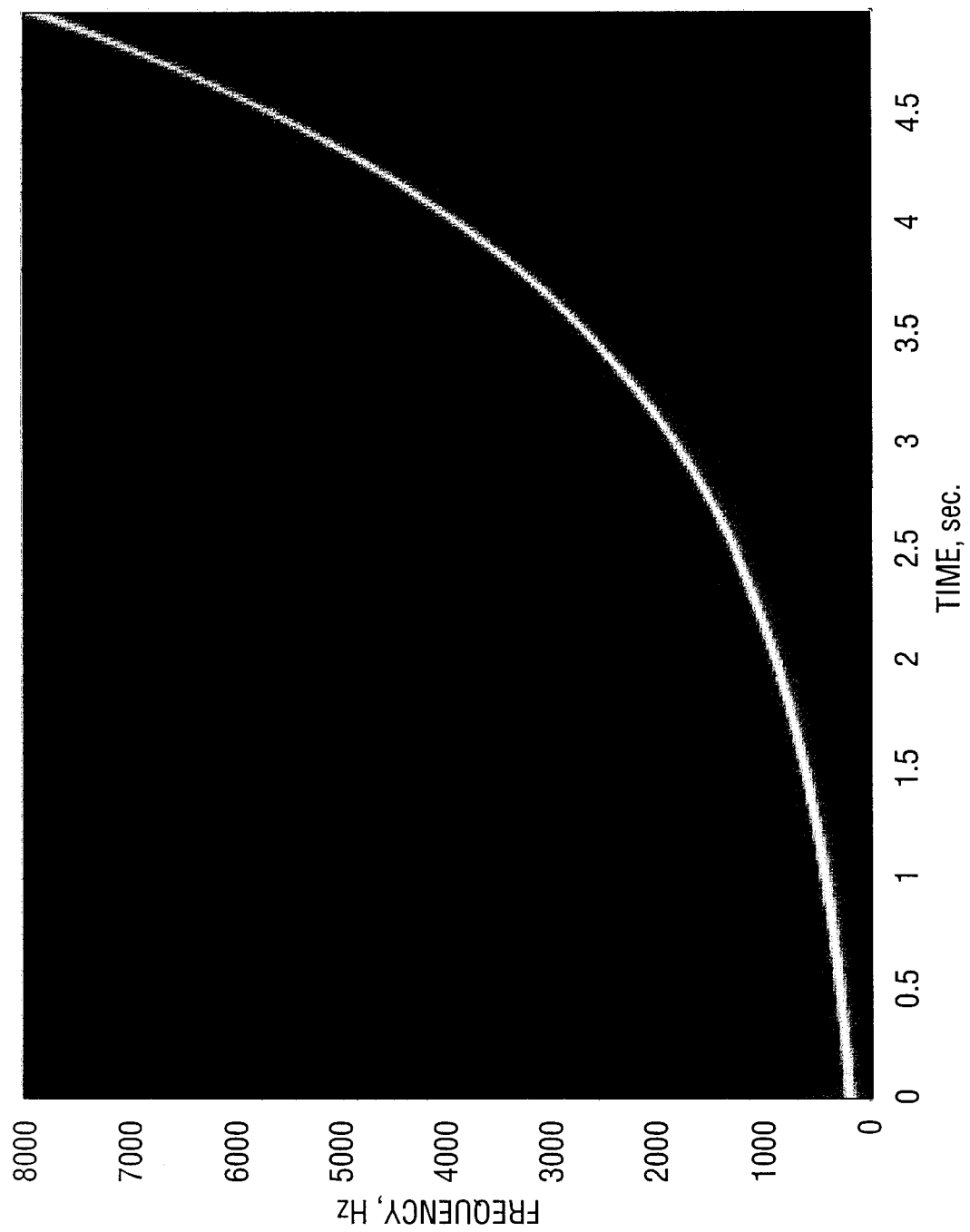
FIG. 19 illustrates the spectrogram for the Warp-15 compressor response to the swept sinusoid.
Figure 20:
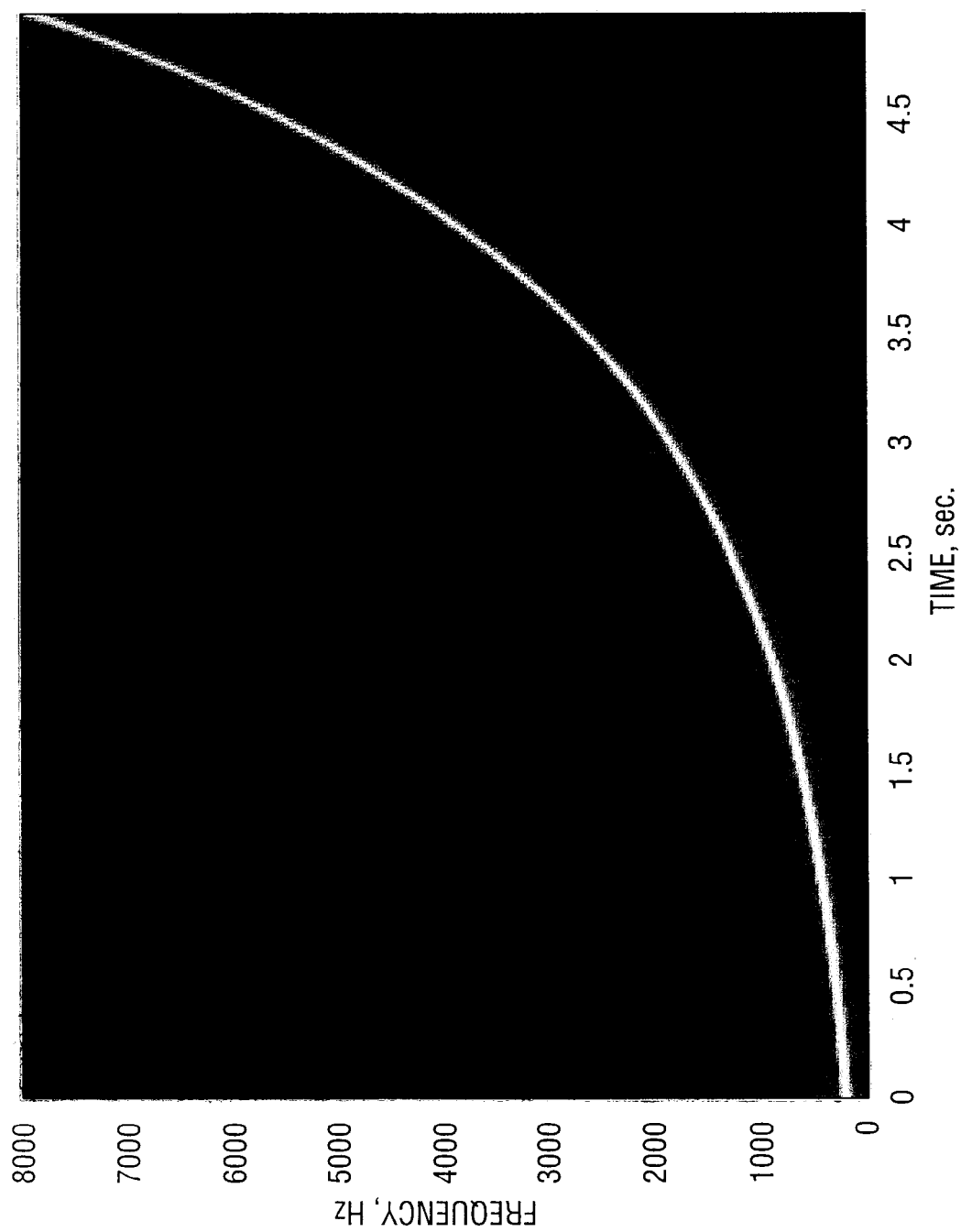
FIG. 20 illustrates the spectrogram for the Warp-31 compressor response to the swept sinusoid.

The compressors that use the side-branch structure eliminate the temporal aliasing distortion, which results in much lower overall distortion levels. The spectrogram for the Side-Branch compressor is shown in FIG. 18. While a time-frequency latticework of distortion products is still present, the level of the distortion products is much lower than for the FFT compressor, being typically 60-70 dB below the level of the swept sinusoid. The spectrogram for the Warp-15 compressor is shown in FIG. 19. This system has lower distortion than the Side-Branch compressor at low frequencies, although somewhat greater distortion is evident when the frequency of the swept tone goes above 6 kHz. The distortion products for the Warp-15 system at low frequencies are typically 70-80 dB below the level of the swept sinusoid. The spectrogram for the Warp-31 compressor is shown in FIG. 20. The distortion for this system is the lowest of all of the systems tested. The distortion product level for the Warp-31 compressor is typically 80-90 dB or more below the level of the swept tone for almost all input frequencies.

As shown above, frequency warping offers several advantages for use as a digital compressor. The warped frequency scale gives a much better match to auditory perception than the uniform frequency scale inherent in conventional digital signal processing. The frequency warping stretches the frequency representation at low frequencies and compresses it at high frequencies. With the appropriate choice of the warping parameter, the warped FFT bins duplicate a Bark frequency scale and the filter bandwidths are therefore constant on the Bark scale.

Simulation results show that a 15-tap warped FIR compression filter, using a 16-point warped FFT, will give results comparable to those from a 31-tap conventional FIR filter designed using a 32-point FFT. The 31-tap warped FIR filter, using a 32-point warped FFT, will give frequency analysis and compression ripple results comparable to those from the 128-point conventional FFT used for frequency-domain processing, but with greatly reduced non-linear distortion. Frequency warping allows a substantial reduction in the system order for comparable frequency resolution, halving the required compression filter length.

The primary disadvantage in implementing frequency warping is the computational cost of replacing unit delays with first-order all-pass filters. The all-pass filters could conceivably double the computational time needed to implement a FIR filter. However, since a filter only half as long is needed for equivalent performance to a conventional FIR compression filter, the net cost should be minimal.

A second concern is the increased group delay at low frequencies. In applications sensitive to amplified signal delay, the increase in group delay at low frequencies could cause potential interference problems between the direct and amplified low-frequency sound. However, the shorter filter needed for the warped compressor and the reduced group delay at high frequencies would help ameliorate this problem.

In summary, comparing the Warp-31 compression system to the FFT compressor shows that the warped compressor provides a flatter swept frequency response, reduced ripple in the swept sinusoid response, reduced non-linear distortion, reduced group delay at mid and high frequencies, a better match between the group delay and auditory latency, and frequency spacing that matches that of the auditory system. Some algorithms operating in the frequency domain such as spectral enhancement may not, however, have enough frequency resolution when implemented using a 32-tap warped FFT. A longer warped FFT can be used, realized either by padding the data sequence with zeroes or by using a longer warped data buffer and accepting the increase in time delay.

As will be understood by those familiar with the art, the present invention may be embodied in other specific forms without departing from the spirit or essential characteristics thereof. Accordingly, the disclosures and descriptions herein are intended to be illustrative, but not limiting, of the scope of the invention which is set forth in the following claims.

What is claimed is:

1. A hearing aid, comprising:
a microphone for providing an input signal;
a signal processor that is adapted to process said input signal in order to provide an output signal; and
a transducer adapted to convert said output signal into an audio signal;
wherein said signal processor is configured to generate one or more frequency warped signals, and comprises a plurality of all-pass filters arranged in series.

2. The hearing aid of claim 1, wherein said signal processor is configured to generate said one or more frequency warped signals from said input signal, and process said one or more frequency warped signals according to a hearing impairment correction algorithm.

3. The hearing aid of claim 1, wherein the signal processor is configured to perform at least a part of a signal processing in a frequency domain.

4. The hearing aid of claim 1, wherein the plurality of all-pass filters comprises a first all-pass filter, and a second all-pass filter that receives information from the first all-pass filter.

5. The hearing aid of claim 1, wherein the processor comprises a finite impulse response filter, and coefficients of the finite impulse response filter have even symmetry.

6. The hearing aid of claim 1, wherein the hearing aid is an in-the-canal hearing aid.

7. The hearing aid of claim 1, wherein the hearing aid is an in-the-ear hearing aid.

8. The hearing aid of claim 1, wherein the hearing aid is a behind-the-ear hearing aid.

9. The hearing aid of claim 1, said signal processor operates on a warped frequency scale that approximates a Bark scale.

10. The hearing aid of claim 1, wherein said series of said plurality of all-pass filters has a cascade configuration.

11. A hearing aid, comprising:
a microphone for providing an input signal;
a signal processor that is adapted to process said input signal in order to provide an output signal; and
a transducer adapted to convert said output signal into an audio signal;
wherein said signal processor is configured to perform a frequency analysis of the input signal, compute one or more frequency-dependent gains according to a hearing impairment correction algorithm, and use said one or more frequency-dependent gains to produce a frequency-warped output signal.

12. The hearing aid of claim 11, wherein said signal processor comprises a plurality of all-pass filters.

13. The hearing aid of claim 12, wherein said plurality of all-pass filters are arranged in series.

14. The hearing aid of claim 11, wherein said signal processor is configured to perform at least a part of a signal processing in a frequency domain.

15. The hearing aid of claim 11, wherein the processor comprises a finite impulse response filter, and coefficients of the finite impulse response filter have even symmetry.

16. The hearing aid of claim 11, wherein said processor is configured to perform said frequency analysis on a warped scale.

17. The hearing aid of claim 11, wherein the hearing aid is an in-the-canal hearing aid.

18. The hearing aid of claim 11, wherein the hearing aid is an in-the-ear hearing aid.

19. The hearing aid of claim 11, wherein the hearing aid is a behind-the-ear hearing aid.

20. The hearing aid of claim 11, said signal processor operates on a warped frequency scale that approximates a Bark scale.

21. The hearing aid of claim 11, wherein said processor comprises a plurality of cascaded all-pass filters.

* * * * *

UNITED STATES PATENT AND TRADEMARK OFFICE
CERTIFICATE OF CORRECTION

PATENT NO. : 8,014,549 B2
APPLICATION NO. : 11/866193
DATED : September 6, 2011
INVENTOR(S) : James Mitchell Kates It is certified that error appears in the above-identified patent and that said Letters Patent is hereby corrected as shown below:

On the title page, item 73 under "Assignee," "RN ReSound A/S (DK)" is changed to "GN ReSound A/S (DK)"

Signed and Sealed this
Twenty-eighth Day of January, 2014

Michelle K. Lee
*Deputy Director of the United States Patent and Trademark Office*